(12) United States Patent
Chae et al.

(10) Patent No.: US 7,272,047 B2
(45) Date of Patent: Sep. 18, 2007

(54) WORDLINE VOLTAGE GENERATING CIRCUIT INCLUDING A VOLTAGE DIVIDING CIRCUIT FOR REDUCING EFFECTS OF PARASITIC CAPACITANCE

(75) Inventors: Dong-Hyuk Chae, Seoul (KR); Dae-Seok Byeon, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 249 days.

(21) Appl. No.: 11/177,842

(22) Filed: Jul. 8, 2005

(65) Prior Publication Data

US 2006/0087899 A1    Apr. 27, 2006

(30) Foreign Application Priority Data

Oct. 27, 2004   (KR) ...................... 10-2004-0086304

(51) Int. Cl.
*G11C 11/34* (2006.01)
*G11C 16/04* (2006.01)
*G11C 7/00* (2006.01)

(52) U.S. Cl. ........................ 365/185.19; 365/185.23; 365/185.03; 365/189.09

(58) Field of Classification Search .......... 365/185.23, 365/185.19, 189.09, 189.11
See application file for complete search history.

(56) References Cited

U.S. PATENT DOCUMENTS

| | | | |
|---|---|---|---|
| 6,642,768 B1 * | 11/2003 | Schell et al. ................. | 327/308 |
| 6,937,180 B1 * | 8/2005 | Muratov et al. ............ | 341/154 |
| 7,038,949 B2 * | 5/2006 | Chae et al. ............ | 365/185.23 |
| 7,110,292 B2 * | 9/2006 | Hahn et al. ............ | 365/185.03 |
| 7,158,418 B2 * | 1/2007 | Chae et al. ............ | 365/185.23 |

FOREIGN PATENT DOCUMENTS

| | | |
|---|---|---|
| JP | 59-198595 | 11/1984 |
| JP | 08-096591 | 4/1996 |
| KR | 0172411 | 10/1998 |
| WO | 0657890 A2 | 6/1995 |

OTHER PUBLICATIONS

English language abstract of the Korean Publication No. 0172411.
English language abstract of the Japanese Publication No. 08-096591.
English language abstract of the Japanese Publication No. 59-198595.

* cited by examiner

*Primary Examiner*—Amir Zarabian
*Assistant Examiner*—Michael Weinberg
(74) *Attorney, Agent, or Firm*—Marger Johnson & McCollom, P.C.

(57) ABSTRACT

Disclosed is a voltage dividing circuit reducing effects of a parasitic capacitance and a wordline voltage generating circuit including that. The voltage dividing circuit according to an aspect of the present invention includes a first resistor, a plurality of second resistors, and a selection means. The first resistor is connected between an output voltage node and a dividing voltage node. The plurality of second resistors are connectable between the dividing voltage node and a ground. The second resistors are sequentially selected in response to a step control signal and connected to ground. In order to reduce the sum of a parasitic capacitance existing in the second resistors, the resistors are arranged in groups, and the selection means connects only that group that contains a selected resistor to the dividing voltage node.

21 Claims, 6 Drawing Sheets

WORDLINE VOLTAGE GENERATING CIRCUIT INCLUDING A VOLTAGE DIVIDING CIRCUIT FOR REDUCING EFFECTS OF PARASITIC CAPACITANCE

CROSS-REFERENCE TO RELATED APPLICATIONS

This application hereby claims priority under 35 U.S.C. § 119 to Korean Patent Application 2004-86304 filed on Oct. 27, 2004. The entire contents of Korean Patent Application 2004-86304 is hereby incorporated herein by reference.

FIELD OF THE INVENTION

The present invention relates to semiconductor memory devices, and more particularly to wordline voltage generating circuits.

BACKGROUND OF THE INVENTION

Semiconductor memory devices are generally classified into Random Access Memory (RAM) and Read Only Memory (ROM) devices. Semiconductor memory devices can also be classified as volatile or non volatile. A volatile memory loses data if power is not supplied. A nonvolatile memory keeps previously stored data even if power is not supplied.

RAM devices include Dynamic RAM (DRAM) and Static RAM (SRAM), and ROM memories. ROM devices include Programmable ROM (PROM), Erasable PROM (EPROM), Electrically EPROM (EEPORM), and flash memories.

Many semiconductor devices have a wordline generating circuit which provides a wordline voltage to memory cells. The wordline generating circuits used in semiconductor memory devices may provide a gradually increased wordline voltage to the memory cells. For example, such a voltage may be applied to a selected wordline in a flash memory device.

Flash memory devices sometimes use an Incremental Step Pulse Programming (hereinafter referred to as "ISSP") to make the width of threshold voltage profile dense during a programming operation. In other words, a wordline voltage is not applied to a memory cell at once, but increased step by step. In flash memory devices, the wordline voltage is generated by a charge pump, a comparator, and a voltage dividing circuit.

The voltage dividing circuit divides a wordline voltage according to the ratio of resistance values and generates a dividing voltage. A comparator compares a reference voltage with the dividing voltage to generate a wanted wordline voltage by turning on or off a charge pump. In such a circuit, the voltage dividing circuit includes a plurality of resistors, which are connected in parallel between a node (hereinafter referred to as "dividing voltage node") and a ground. The dividing voltage depends on the resistance value of the one resistor that is selected for use.

If several wordline voltages need be generated, or if the voltage difference between the wordline voltages is small, the number of resistors connected between the dividing voltage node and the ground must be relatively large. As more resistors are connected in parallel, the sum of the parasitic capacitance increases. When the parasitic capacitance increases, the dividing voltage may not keep up with variations in the wordline voltage at high speed operation. As a result, there is a likelihood that overshoot will occur in the wordline voltage. Furthermore, there may be a ripple in the wordline voltage rather than there being a constant wordline voltage.

SUMMARY OF THE INVENTION

The present invention is directed to, among other things, a voltage dividing circuit capable of reducing the effect of parasitic capacitance.

The present invention is also directed to a wordline voltage generating circuit capable of generating a stable wordline voltage with small overshoot.

One aspect of the present invention provides a voltage dividing circuit comprising a first resistor connected between an output voltage node and a dividing voltage node; a first section circuit connected to said voltage dividing node, a plurality of second resistors connected in parallel to the first selection circuit, each second resistor being selectively connectable to ground by a second selection circuit which sequentially connects the resistors to ground in response to a step control signal. The first selection circuit connecting a group of the second resistors to the dividing voltage node when any resistor in a group is connected to ground by the second selection circuit.

According to another aspect of the invention, a wordline voltage generating circuit comprises a charge pump providing a wordline voltage to a selected memory cell in response to a clock signal; a voltage dividing circuit for dividing the wordline voltage to generate a dividing voltage; and a charge pump control circuit for comparing the dividing voltage and a reference voltage to generate the clock signal. The voltage dividing circuit includes a first resistor connected between a wordline voltage node and a dividing voltage node. A first selection circuit is connected to the voltage node. A plurality of second resistors is connected in parallel between the first selection circuit and a second selection circuit. The second selection circuit selectively connects the second resistors to ground. The first selection circuit connects a group of the second resistors to the dividing voltage node when any resistor in a group is connected to ground by the second selection circuit.

According to another aspect of the present invention, the second resistors in the voltage divider circuits referred to above can be divided into two parts. The first part can be a single resistor common to all the resistors and the second part can be parallel individual resistors selectively connected to the first part.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Hereinafter, an exemplary embodiment of the present invention will be described in conjunction with the accompanying drawings.

Figure 1:
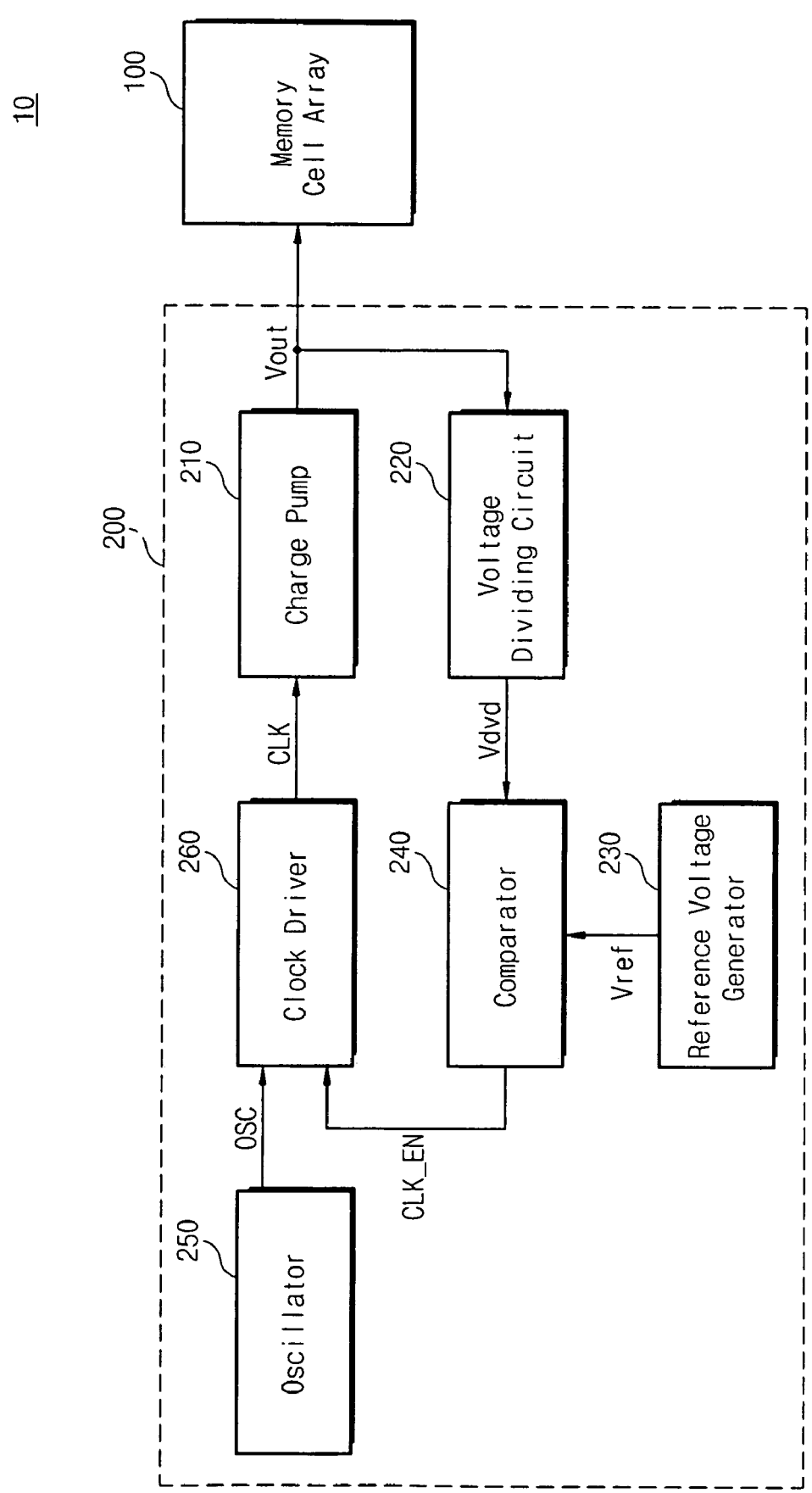
FIG. 1 is a block diagram showing a wordline voltage generating circuit.

FIG. 1 is a block diagram showing a wordline voltage generating circuit according to a first embodiment of the present invention. As shown in FIG. 1, a flash memory device 10 includes a memory cell array 100 and a wordline voltage generating circuit 200. The wordline voltage generating circuit 200 provides a stable output voltage Vout with a small amount of overshoot and ripple.

The memory cell array 100 has a plurality of memory cells (not shown in the Figure) connected to a word line and a bit line. Such an array and the connections to the array are conventional. The wordline voltage generating circuit 200 selectively applies a wordline voltage to a selected memory cell during a write/read/erase operation.

As shown in FIG. 1, the wordline voltage generating circuit 200 includes a charge pump 210, a voltage dividing circuit 220, a reference voltage generator 230, a comparator 240, an oscillator 250, and a clock driver 260.

The charge pump 210 generates an output voltage Vout in response to a clock signal CLK. In order to increase the output voltage Vout in a step-by-step manner, the voltage dividing circuit 220 includes a plurality of resistors that are respectively selected in response to sequentially activated step control signals. As will be described hereinafter, the voltage dividing circuit 220 includes a means for reducing the parasitic capacitance in the plurality of resistors.

The comparator 240 compares the dividing voltage Vdvd with a reference voltage Vref to generate a clock enable signal CLK_EN. The comparator 240 receives the dividing voltage Vdvd and the reference voltage Vref from the voltage dividing circuit 220 and the reference voltage generator 230, respectively. The comparator 240 activates the clock enable signal CLK_EN when the dividing voltage Vdvd is lower than the reference voltage Vref. The oscillator 250 generates an oscillation signal OSC. The clock driver 260 outputs a clock signal CLK in response to the clock enable signal CLK_EN and the oscillation signal OSC.

Figure 2:
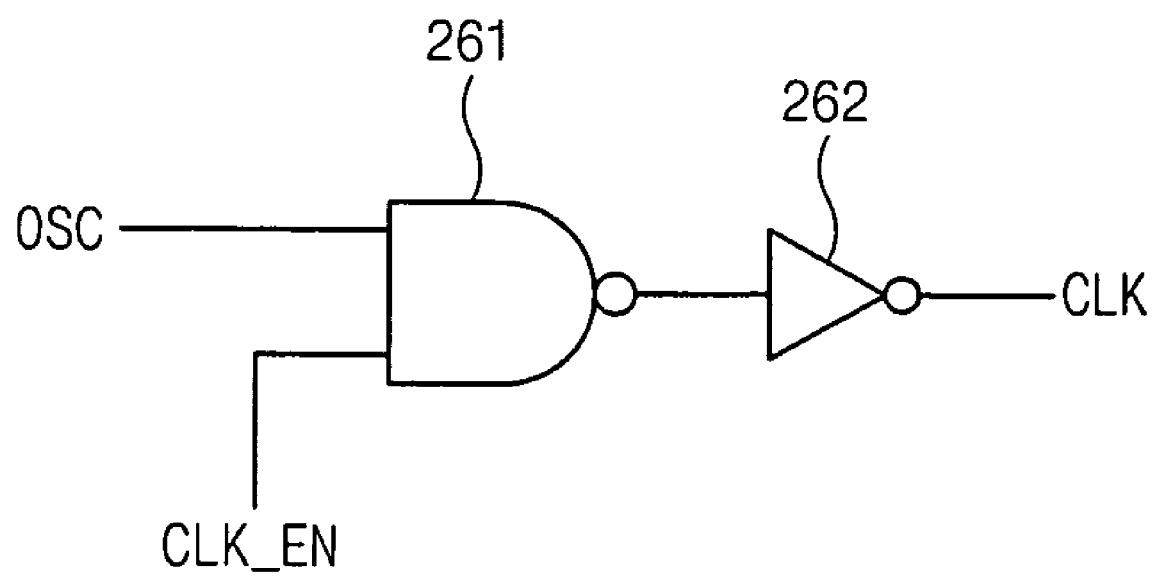
FIG. 2 is a circuit diagram showing a preferred embodiment of a clock driver shown in FIG. 1.

The details of the clock driver 260 are shown in FIG. 2. The circuit includes a NAND gate 261 and an inverter 262. For example, if the clock enable signal CLK_EN becomes active high, the oscillation signal OSC is outputted as an output signal. In this situation, the charge pump 210 is operated. On the contrary, when the clock enable signal is inactive low, the oscillation signal OSC is cut off so that the clock signal CLK is not toggled. In this situation, the charge pump 210 is not operated.

The charge pump control circuit consists of the reference voltage generator 230, the comparator 240, the oscillator 250, and the clock driver 260. If an output voltage Vout is lower than the desired voltage, the charge pump control circuit generates a clock signal CLK to operate the charge pump 210. If the output voltage Vout reaches a desired voltage, the charge pump control circuit does not generate the clock signal CLK and the charge pump 210 is not operated. A desired output voltage Vout is thus generated.

Figure 3:
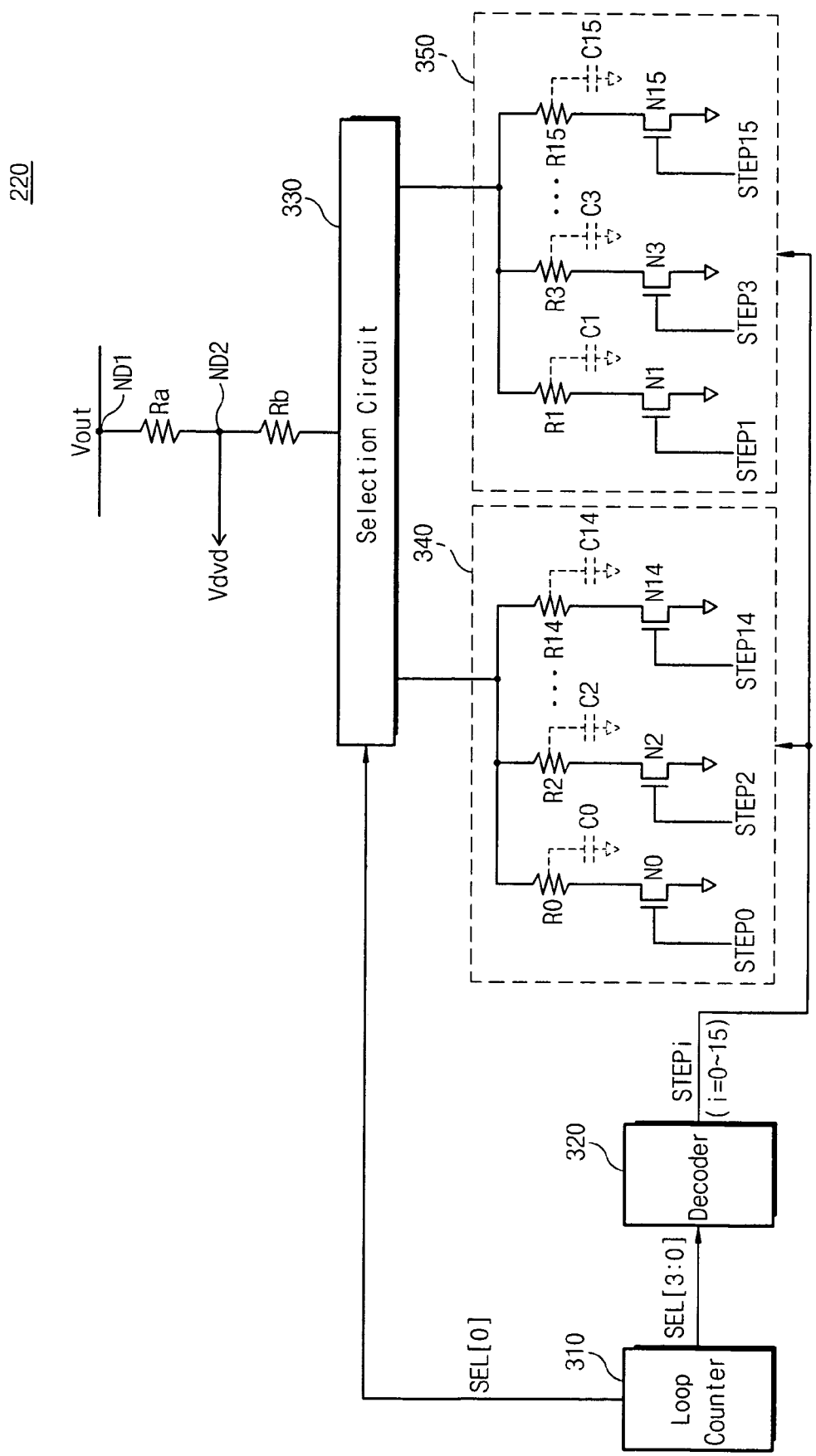
FIG. 3 is a circuit diagram showing a first preferred embodiment of a voltage dividing circuit according to an aspect of the present invention.

FIG. 3 is a circuit diagram showing a preferred first embodiment of the voltage dividing circuit 220 shown in FIG. 1. Referring to FIG. 3, the voltage dividing circuit 220 includes a first resistor Ra, a second resistor Rb, a loop counter 310, a decoder 320, a selection circuit 330, a first step resistor unit 340, and a second step resistor unit 350.

The first resistor Ra is connected between an output voltage node ND1 and a dividing voltage node ND2. The second resistor Rb is connected between the dividing voltage node ND2 and the selection circuit 330. The second resistor Rb is used in common with the first and second step resistor units 340 and 350. As a result of using the second resistor Rb in common, it is possible to reduce layout area and to reduce parasitic capacitance.

The loop counter 310 counts a value of n-bits (n being any natural number) in response to an embedded record timer or a count up (Count_Up) signal applied from an external source. For instance, the loop counter 310 counts program loop times during a program operation by the ISPP. The decoder 320 decodes the count value of the loop counter 310 to generate step control signals (STEPi; e.g., i=0~15). For example, as 4-bit count value of the loop counter 310 is increased (e.g., 0000, 0001, 0010, . . . , 1111), step control signals (STEP0, STEP1, STEP2, . . . , STEP15) are sequentially activated. Meanwhile, the loop counter circuit 310 outputs a lower m-bit value (m being any natural number) of a sequentially increased count value as a selection signal SEL[m-1:0].

The selection circuit 330 selects the first step resistor unit 340 or the second step resistor unit 350 in response to the selection signal SEL[0]. For instance, if the selection signal is "0" (that is, SEL[0]=0), the first step resistor unit 340 is selected. On the contrary, if the selection signal is "1" (that is, SEL[0]=1), the second step resistor unit 340 is selected.

In this case, the selection means consists of the loop counter 310, the decoder 320, and the selection circuit 330. The selection means selects the first step resistor unit 340 or the second step resistor unit 350 that are to be connected to the second resistor Rb whenever the step control signal is applied.

The first step resistor unit 340 includes a plurality of resistors (R0, R2, . . . , R14) and a plurality of NMOS transistors (N0, N2, . . . , N14). The plurality of resistors (R0, R2, . . . , R14) are connected in parallel with each other. And, each of the resistors and NMOS transistors are respectively connected in series. The NMOS transistors (N0, N2, . . . , N14) are controlled by corresponding step control signals (STEP0, STEP2, . . . , STEP14), respectively. As shown in FIG. 3, the plurality of resistors (R0, R2, . . . , R14) have parasitic capacitances (C0, C2, . . . , C14).

The second step resistor unit 350 has a plurality of resistors (R1, R3, . . . , R15) and NMOS transistors (N1, N3, . . . , N15), and also has the same construction as the first step resistor unit 340. The plurality of resistors (R1, R3, . . . , R15) have the parasitic capacitances (C1, C3, . . . , C15), respectively.

The voltage dividing circuit 220 of FIG. 3 creates a step control signal as the 4-bit count value of the loop counter 310 is increased. The sequentially activated step control signal alternately turns on NMOS transistors of the first and second step resistor units 340 and 350. That is, the NMOS transistor N0 of the first step resistor unit 340 is turned on in response to the step control signal STEP0. Then, the NMOS transistor N1 of the second step resistor unit 350 is turned on in response to the step control signal STEP1. At the same time, the selection circuit 330 alternately selects the first step resistor unit 340 or the second step resistor unit 350 according to the lowermost bit count value of the loop counter 310. In other words, if the step control signal STEPi is inputted to the first step resistor unit 340, the selection signal 330 selects the first step resistor unit 340. If the step control signal STEPi is inputted to the second step resistor unit 350, the selection circuit 330 selects the second step resistor unit 350.

In a voltage dividing circuit including a conventional selection means, when the step control signal is applied, the sum of the parasitic capacitance existing in the step resistor unit is C0+C1+C2+ ... +C14+C15. However, with the voltage dividing circuit according to an aspect of the present invention, the sum of the parasitic capacitance existing on the step resistor unit becomes C0+C2+ ... +C14 (where C1, C3 etc. are missing from the sum) or C1+C3+ ... C15. (where C0, C2 etc. are missing from the sum). Therefore, with the present invention, the sum of the parasitic capacitance is approximately reduced by a half.

It is noted that the circuit contains two selection circuits. Selection circuit 330 is a first selection circuits that connects groups of resistors to the resistor Rb. Switches N0 to N15 form a second selection circuit that connects the resistors in response to signals from decoder 320.

Figure 4:
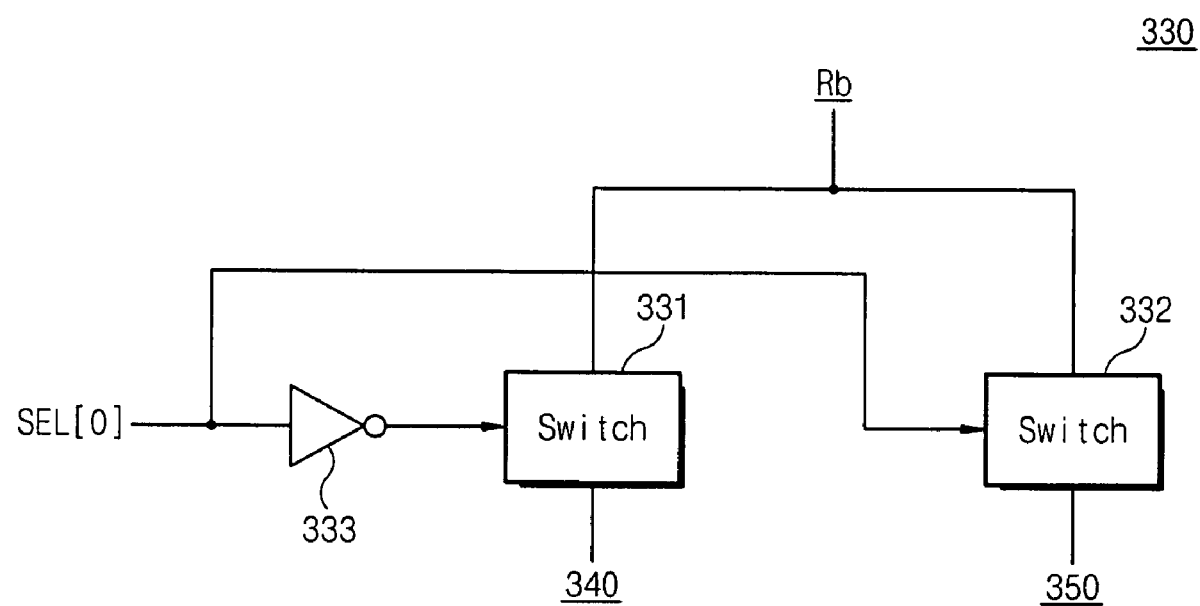
FIG. 4 is a circuit diagram showing a selection circuit shown in FIG. 3.

FIG. 4 shows a preferred embodiment of the selection circuit 330 shown in FIG. 3. Referring to FIG. 4, the selection circuit 330 includes two switches 331 and 332, and one inverter 333. The first switch 331 is connected between the second resistor Rb and the second step control unit 350. The selection circuit 330 turns on the first switch 331 or the second switch 332 in response to the selection signal SEL[0]. In other words, if the selection signal SEL[0] is "0", the first switch 331 is turned on. If the second selection signal SEL[0] is "1", the second switch 332 is turned on.

Figure 5:
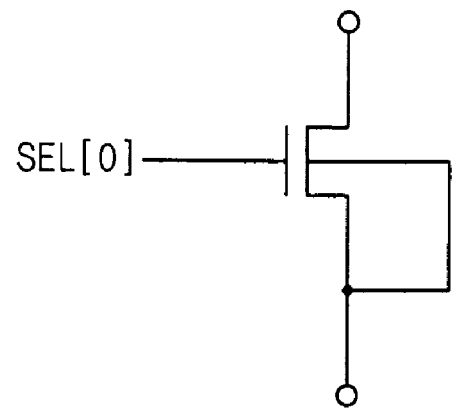
FIGS. 5 and 6 are circuit diagrams showing a switch shown in FIG. 4.
Figure 6:
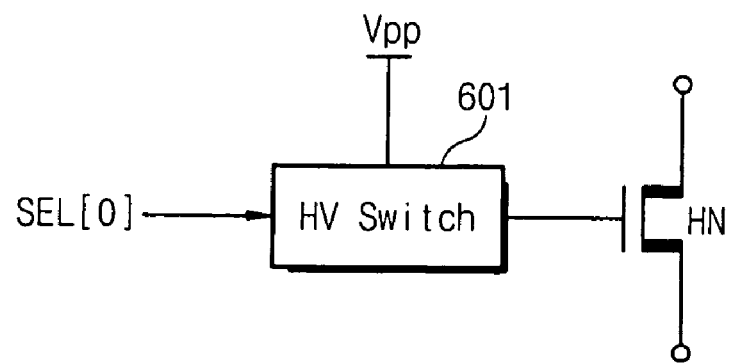

FIGS. 5 and 6 show preferred embodiments of the switch circuits shown in FIG. 4. The switch of FIG. 5 consists of one NMOS transistor. In the NMOS transistor, a bulk and a source are connected. The reason for this is that a voltage of a drain is transferred to the source by preventing the increment of the threshold voltage even when a voltage inputted to a gate is low.

The switch circuit shown in FIG. 6 includes a high voltage switch 601 so as to turn on a high voltage NMOS transistor HN to a low voltage selection signal SEL[0]. The high voltage switch receives a selection signal operated in a low voltage (e.g., 0V~1.5V) to provide a high voltage VPP to the high voltage NMOS transistor HN.

Figure 7:
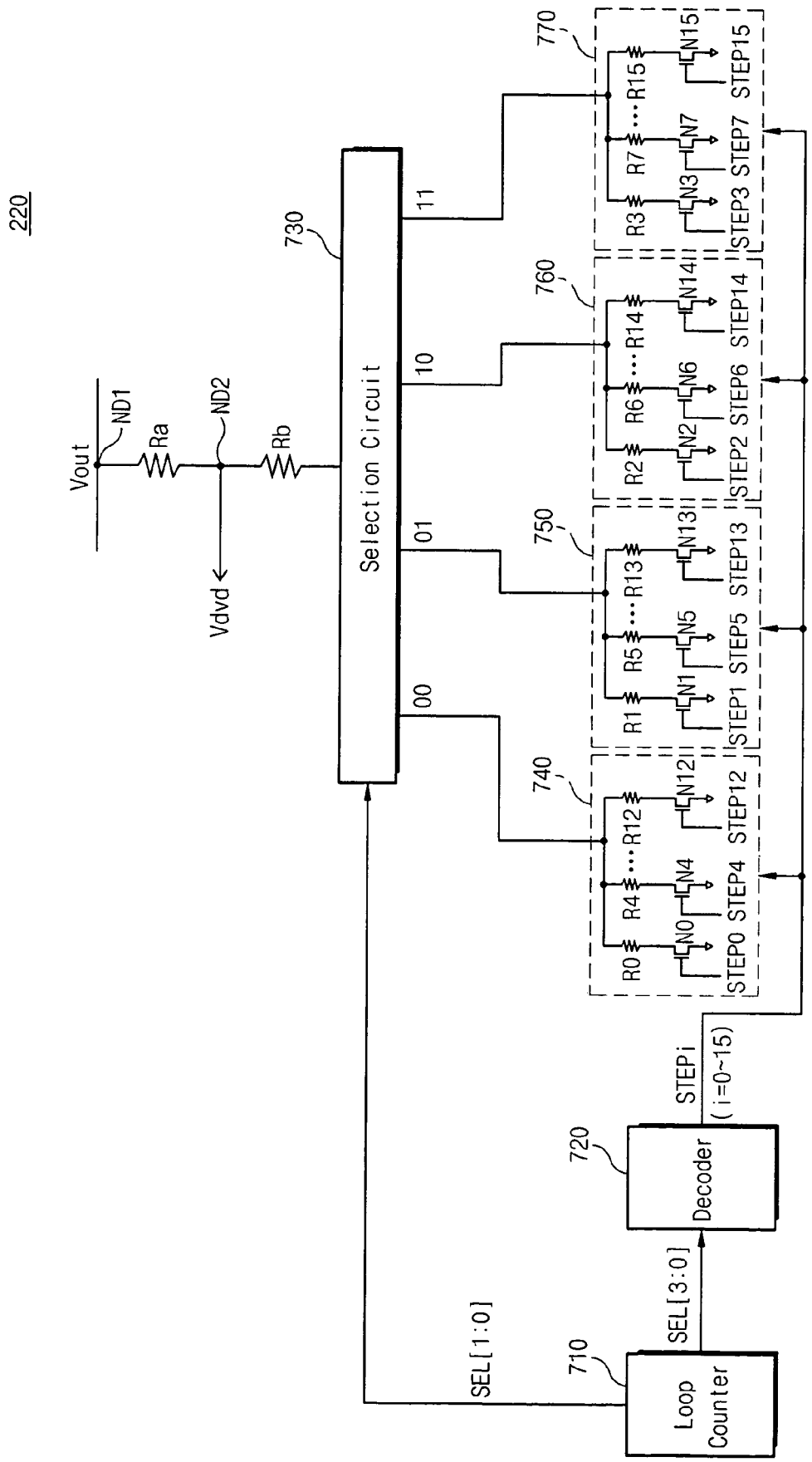
FIG. 7 is a circuit diagram showing a second preferred embodiment of the voltage dividing circuit shown in FIG. 1 according to an another aspect of the present invention.

FIG. 7 is a circuit diagram showing a second preferred embodiment of the voltage dividing circuit shown in FIG. 1. Referring to FIG. 7, the voltage dividing circuit 220 includes a first resistor Ra, a second resistor Rb, a loop counter 710, a decoder 720, a selection circuit 730, and first to fourth resistor units 740, 750, 760, and 770.

The voltage dividing circuit of FIG. 7 selects one of the first to fourth resistor units 740, 750, 760, and 770 in response to a lower 2-bit selection signal SEL[1:0] of the loop counter 710. Accordingly, the sum of a parasitic capacitance existing in a step resistor unit is approximately reduced to one-fourth as compared with a conventional art in the voltage dividing circuit.

As previously mentioned, in the voltage dividing circuit according to an aspect of the present invention, only partial resistors among the second resistors are connected to the first resistor when the step control signal is applied, and it is thus possible to reduce the effect of the parasitic capacitance existing in the second resistors. In addition, because the wordline voltage generating circuit includes a voltage dividing circuit reducing the effect of the parasitic capacitance, stable wordline voltage with small overshoot can be provided.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A voltage dividing circuit having an output voltage node, a dividing voltage node, a ground, and a circuit for receiving a step control signal, said voltage dividing circuit comprising:
    a first resistor connected between said output voltage node and said dividing voltage node;
    a plurality of second resistors connectable between said dividing voltage node and said ground, said second resistors being sequentially selected and connected to ground in response to said step control signal, said second resistors being divided into a plurality of groups; and
    a selection means for selectively connecting a group of commonly connected resistors among the second resistors to the dividing voltage node when the step control signal activates any resistor in the group of second resistors.

2. The voltage dividing circuit as set forth in claim 1, further comprising a third resistor serially connected between the dividing voltage node and the plurality of second resistors.

3. The voltage dividing circuit as set forth in claim 1, wherein NMOS transistors are connected between each of the second resistors and ground, and wherein
    the step control signal is inputted to the NMOS transistors.

4. The voltage dividing circuit as set forth in claim 1, wherein each of the second resistors has a different resistance value.

5. The voltage dividing circuit as set forth in claim 1, wherein the selection means includes:
    a loop counter for increasing an n-bit count value and generating a lower m-bit of the count value as a selection signal; and
    a decoder for decoding the n-bit count value to sequentially activate the step control signal.

6. The voltage dividing circuit as set forth in claim 5, wherein the selection means has a switch between the dividing voltage node and the group of second resistors.

7. The voltage dividing circuit as set forth in claim 6, wherein
    the switch is constituted by an NMOS transistor where a bulk and a source are connected, and wherein
    the NMOS transistor is controlled by the selection signal.

8. The voltage dividing circuit as set forth in claim 6, wherein the switch includes:
    an NMOS transistor having an endurance to a high voltage; and
    a high voltage switch controlling the NMOS transistor, wherein the high voltage switch is controlled by the selection signal.

9. The voltage dividing circuit as set forth in claim 1, wherein
    a voltage of the output voltage node is increased step by step as the step control signal is sequentially activated.

10. A wordline voltage generating circuit comprising:
    a charge pump providing a wordline voltage to a selected memory cell in response to a clock signal;

a voltage dividing circuit for dividing the wordline voltage to generate a dividing voltage; and a charge pump control circuit for comparing the dividing voltage and a reference voltage to generate the clock signal, wherein the voltage dividing circuit includes:

a first resistor connected between a wordline voltage node and a dividing voltage node;

a plurality of second resistors connected in parallel between the dividing voltage node and a ground, and sequentially selected in response to a step control signal that is sequentially activated, said second resistors being divided into groups of commonly connected resistors; and a selection means for connecting a group of said second resistors to said dividing voltage node when the step control signal selects any resistor in the group.

11. The wordline voltage generating circuit as set forth in claim 10, wherein the charge pump control circuit includes:

a comparator for activating a clock enable signal when the dividing voltage is lower than the reference voltage;

an oscillator for generating an oscillation signal; and a clock driver for generating the clock signal in response to the clock enable signal and the oscillation signal.

12. The wordline voltage generating circuit as set forth in claim 11, wherein the clock driver includes:

a NAND gate for receiving the clock enable signal and the oscillation signal; and an inverter for inverting an output of the NAND gate to generate the clock signal.

13. The wordline voltage generating circuit as set forth in claim 10, further comprising a third resistor serially connected between the dividing voltage node and the plurality of second resistors.

14. The wordline voltage generating circuit as set forth in claim 10, wherein NMOS transistors are connected between each of the second resistors and the ground, respectively, and wherein the NMOS transistors receive the step control signal.

15. The wordline voltage generating circuit as set forth in claim 10, wherein each of the second resistors has a different resistance value.

16. The wordline voltage generating circuit as set forth in claim 10, wherein the selection means includes:

a loop counter for increasing an n-bit count value and generating a lower m-bit of the count value as a selection signal;

a decoder for decoding the n-bit count value and then activating the step control signal sequentially; and a selection circuit for connecting only the group of second resistors including at least one selected second resistor with the first resistor in response to the selection signal.

17. The wordline voltage generating circuit as set forth in claim 16, wherein the selection circuit has a switch between the dividing voltage node and the group of second resistors.

18. The wordline voltage generating circuit as set forth in claim 17, wherein the switch is composed of a NMOS transistor where a bulk and a source are connected, and wherein the NMOS transistor is controlled by the selection signal.

19. The wordline voltage generating circuit as set forth in claim 17, wherein the switch includes:

an NMOS transistor having an endurance to a high voltage; and a high voltage switch controlling the NMOS transistor, wherein the high voltage switch is controlled by the selection signal.

20. The wordline voltage generating circuit as set forth in claim 10, wherein the wordline voltage is increased step by step as the step control signal is sequentially activated.

21. A voltage dividing circuit having an output voltage node, a dividing voltage node, and a ground, said circuit receiving a step control signal, said voltage dividing circuit comprising:

a first resistor connected between said output voltage node and said dividing voltage node;

a plurality of second resistors connectable between said dividing voltage node and said ground, said second resistors being divided into a plurality of groups of commonly connected second resistors a first selection circuit for selectively connecting a group of resistors among the second resistors to the dividing voltage node when any resistor in the group of resistors is connected to ground; and a second selection circuit for sequentially connecting said second resistors to ground in response to said step control signal.

* * * * *